United States Patent
Thomann et al.

(10) Patent No.: US 6,809,990 B2
(45) Date of Patent: Oct. 26, 2004

(54) DELAY LOCKED LOOP CONTROL CIRCUIT (75) Inventors: Mark R. Thomann, Boise, ID (US); Wen Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 3 days.

(21) Appl. No.: 10/177,218

(22) Filed: Jun. 21, 2002

(65) Prior Publication Data
US 2003/0235106 A1 Dec. 25, 2003

(51) Int. Cl.[7] ................................................. G11C 8/00
(52) U.S. Cl. .................. 365/233; 365/194; 365/230.03
(58) Field of Search ................................ 365/233, 194, 365/230.03

(56) References Cited

U.S. PATENT DOCUMENTS

| | | | | |
|---|---|---|---|---|
| 5,708,611 A | * | 1/1998 | Iwamoto et al. | 365/195 |
| 5,920,518 A | | 7/1999 | Harrison et al. | 365/233 |
| 6,011,732 A | | 1/2000 | Harrison et al. | 365/194 |
| 6,173,432 B1 | | 1/2001 | Harrison | 716/1 |
| 6,359,482 B1 | | 3/2002 | Miller et al. | 327/147 |
| 6,381,194 B2 | | 4/2002 | Li | 365/233 |
| 6,438,060 B1 | | 8/2002 | Li | 365/227 |
| 6,446,180 B2 | | 9/2002 | Li et al. | 711/167 |
| 6,525,988 B2 | * | 2/2003 | Ryu et al. | 365/233 |
| 6,556,489 B2 | | 4/2003 | Gomm et al. | 365/194 |
| 6,605,969 B2 | | 8/2003 | Mikhalev et al. | 327/158 |
| 2002/0057119 A1 | | 5/2002 | Stubbs et al. | 327/158 |

OTHER PUBLICATIONS

US 6,249,165, 6/2001, Harrison (withdrawn)

* cited by examiner

*Primary Examiner*—Hoai Ho
(74) *Attorney, Agent, or Firm*—Schwegman, Lundberg, Woessner & Kluth, P.A.

(57) ABSTRACT

A memory device includes delay locked loop that generates an internal signal based on an external signal. The internal signal serves a reference clock signal for most modes operations of the memory device. In a self refresh mode, the delay locked loop is completely deactivated to completely deactivate the internal signal. In a non-self refresh mode, the delay locked loop is periodically deactivated to periodically deactivate the internal signal based on certain modes of operations of the memory device.

48 Claims, 9 Drawing Sheets

DELAY LOCKED LOOP CONTROL CIRCUIT

FIELD

The present invention relates generally to integrated circuits, and in particular to memory devices having delay locked loop circuits.

BACKGROUND

Delay locked loop (DLL) circuits reside in many memory devices to receive an external signal to generate an internal signal. The DLL automatically keeps the internal signal synchronized with the external signal. The internal signal usually serves as a reference signal for the memory devices instead of the external signal because the internal signal matches internal operating conditions of the memory devices, such as process, voltage, and temperature, better than the external signal does.

A typical memory device has many memory cells to store data. The memory device writes data into the memory cells during a write mode and reads the data stored in the memory cells during a read mode. The memory device also has other modes of operations.

In some modes of operations, the memory device uses the internal clock signal generated by the DLL. In other modes of operations, the internal clock signal is unused. Therefore, keeping the DLL active all the time wastes power.

SUMMARY OF THE INVENTION

Various embodiments of the invention provide circuits and methods to periodically deactivate a DLL in certain modes of operations of a memory device.

In one aspect, the memory device includes a plurality of memory banks for storing data and a clock path for receiving an external signal to generate an internal signal to control a transfer of the data from the memory banks. The clock path includes a delay locked loop for synchronizing the external and internal signals. The memory device also includes a clock path controller for periodically deactivating the delay locked loop in response to modes of operations of the memory device.

In another aspect, a method of operating a memory device includes generating an internal signal based on an external signal. The method further includes partially deactivating the internal signal within each cycle of a periodic signal when the memory device is in certain modes of operations.

DESCRIPTION OF EMBODIMENTS

The following description and the drawings illustrate specific embodiments of the invention sufficiently to enable those skilled in the art to practice it. Other embodiments may incorporate structural, logical, electrical, process, and other changes. Examples merely typify possible variations. Portions and features of some embodiments may be included in or substituted for those of others. The scope of the invention encompasses the full ambit of the claims and all available equivalents.

Figure 1:
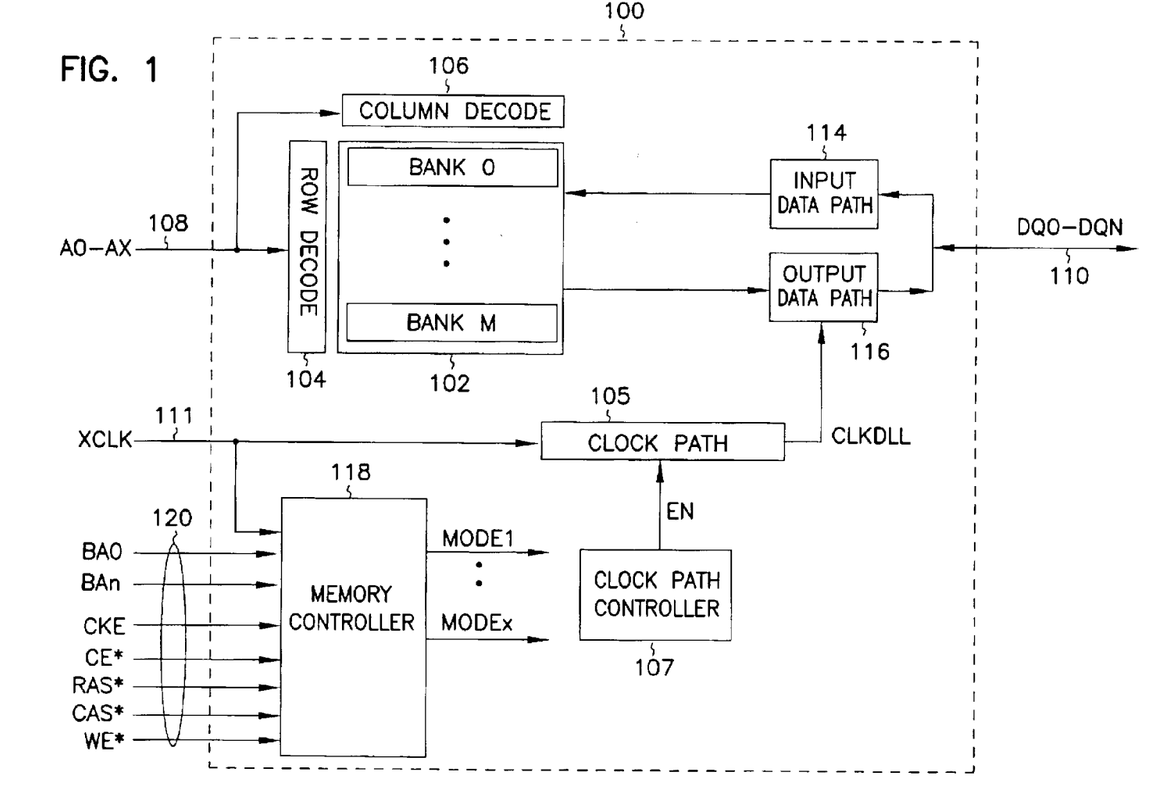
FIG. 1 shows a memory device according to an embodiment of the invention.

FIG. 1 shows a memory device according to an embodiment of the invention. Memory device 100 includes a main memory 102 that has a plurality of memory cells arranged in rows and columns. The memory cells group into a plurality of memory banks indicated by banks 0-M. Row decode 104 and column decode 106 access individual memory cells in response to address signals A0–AX on address lines (or address bus) 108. A data input path 114 and a data output path 116 transfer data between banks 0–M and data lines (or data bus) 110. Data lines 110 carry data signals DQ0 through DQN (DQ0–DQN). A memory controller 118 controls the modes of operation of memory device 100 based on control signals on control lines 120. The control signals include, but are not limited to, a Chip Select signal CAS*, a Row Access Strobe signal RAS*, a Column Access Strobe CAS* signal, a Write Enable signal WE*, a Clock Enable signal CKE, and Bank Address signals BA0 through BAn (BA0–BAn).

Memory device 100 further includes a clock path 105 for generating an internal clock signal CLKDLL based on an external signal XCLK at an external node 111. A clock path controller 107 generates an enable signal EN to periodically deactivate the CLKDLL signal based on certain modes of operations memory device 100. Mode signals MODE1 through MODEx indicate the modes of operations. The XCLK signal and the CLKDLL signal are periodic signals. In some embodiments, the XCLK and CLKDLL signals have the same frequency.

In some embodiments, memory device 100 is a dynamic random access memory (DRAM) device. Examples of DRAM devices include synchronous DRAM commonly referred to as SDRAM (Synchronous Dynamic Random Access Memory), SDRAM II, SGRAM (Synchronous Graphics Random Access Memory), DDR SDRAM (Double Data Rate SDRAM), DDR II SDRAM, and Synchlink or Rambus DRAMs. Those skilled in the art recognize that memory device 100 includes other elements which are not shown for clarity.

Memory device 100 has several modes of operation including an active mode, a write mode, a read mode, a bank active mode, and a self refresh mode. A mode is also referred to as a memory operation. These modes are similar to that of conventional memory devices known to those skilled in the art. Therefore, detailed operations of these modes are not described here.

In a write mode, controller 118 activates a write signal at the start of the write mode when certain a combination of the CS*, RAS*, CAS*, and WE* signals is decoded by controller 118 as valid for the write mode. The DQ0–DQN signals are passed to input path 114. Memory device 100 subsequently writes data represented by the DQ0–DQN signals into memory cells of banks 0–M.

In a read mode, controller 118 activates a read signal at the start of the read mode when a certain combination of the CS*, RAS*, CAS*, and WE* signals is decoded by controller 118 by as valid for the read mode. Data is read from memory cells of banks 0-M. The data is passed to output path 116 which subsequently outputs the data as the DQ0–DQN signals to data lines 110.

In some embodiments, before the data is written into the memory cells, or before the data is read from the memory cells, an active mode is performed. Controller 118 activates an active signal at the start of the active mode when a certain combination of the CS*, RAS*, CAS*, and WE* signals is decoded by controller 118 as valid for the active mode. During the active mode, one of the banks 0-M is activated (selected). A row of memory cells in the activated memory bank is activated (opened) in preparation for the write mode or the read mode. A combination of the BA0–BAn signals selects the bank. A combination of the address signals A0–AX selects the row. If a write mode follows the active mode, the activated row is accessed and data is written into the memory cells of the activated row. If a read mode follows the active mode, the activated row is accessed and data is read from the memory cells of the activated row.

Memory device 100 performs a self refresh mode to retain data in the banks 0–M. Controller 118 activates a self refresh enable signal at the start of the self refresh mode when a certain combination of the CS*, RAS*, CAS*, WE*, and CKE signals is decoded by controller 118 as valid for the self refresh mode. During the self refresh mode, memory device 100 updates the data in banks 0-M to keep data valid.

Figure 2:
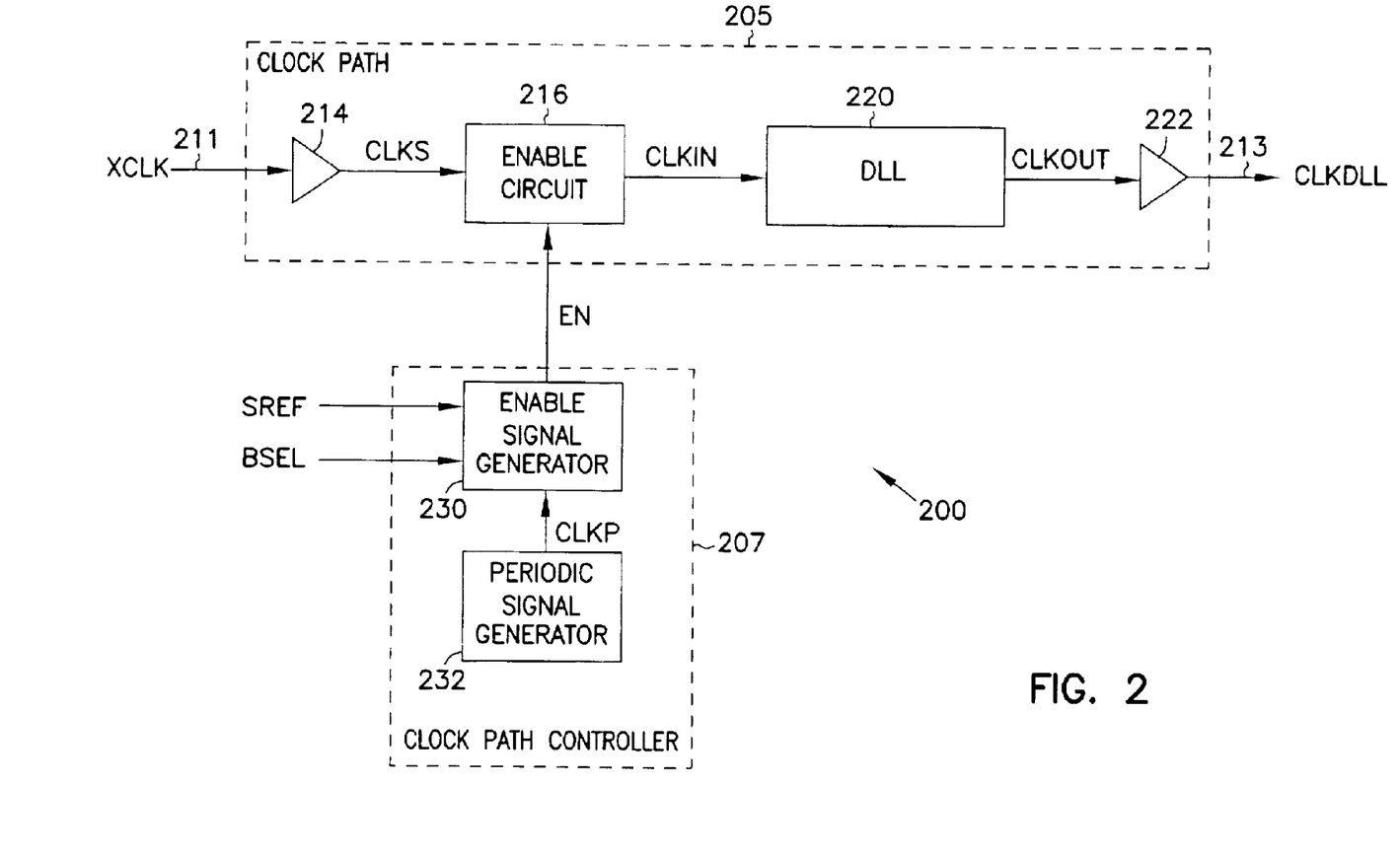
FIG. 2 shows a portion of the memory device of FIG. 1.

FIG. 2 shows a portion of memory device 100 of FIG. 1. Portion 200 includes a clock path 205 and a clock path controller 207 which correspond to clock path 105 and clock path controller 107 (FIG. 1). Clock path 205 includes an input node 211 for receiving the XCLK signal and an output node 213 to output the CLKDLL signal. An input buffer 214 receives the XCLK signal and outputs a signal CLKS. An enable circuit 216 receives the CLKS and outputs a signal CLKIN based on the EN signal. A delay locked loop (DLL) 220 receives the CLKIN signal and outputs a signal CLK-OUT. An output buffer 222 receives the CLKOUT signal and outputs the CLKDLL signal. DLL 220 is a delay circuit that adjusts a delay applied to the CLKIN signal so that the XCLK and CLKDLL signals are synchronized. Those skilled in the art recognize that many conventional delay circuits exist and can be used for DLL 220. Therefore, the specification does not describe detail of DLL 220.

Clock path controller 207 includes input nodes to receive a self refresh enable signal SREF, a bank select signal BSEL, and a periodic signal CLKP, and an output node to output the EN signal. A periodic signal generator 232 generates the CLKP signal. The SREF and BSEL signals correspond to two of the MODE1 through MODEx signals (FIG. 1).

Clock path 205 generates the CLKDLL signal based on the XCLK signal. The CLKDLL signal serves as a reference clock signal for some modes of operations of memory device 100 (FIG. 1). For example, the CLKDLL signal serves as reference clock signal during a read mode to control a transfer of data on data output path between banks 0-M and data lines 110 (FIG. 1). In some cases, the CLKDLL signal is not needed. Therefore, deactivating (turning off) the CLKDLL signal prevents it from toggling, and saves power.

Clock path controller 207 controls clock path 205 to activate (turn on) DLL 220 when the CLKDLL signal is needed and deactivates (turn off) DLL 220 when the CLKDLL signal is not needed. Clock path controller 207 activates or deactivates the EN signal to activate or deactivate DLL 220 based on certain modes of operations of memory device 100 (FIG. 1). In some embodiments, the EN signal is not activated or deactivated during the entire cycle time of each cycle of the CLKP signal; the EN signal is activated and deactivated at different time intervals within each cycle of the CLKP. Therefore, the EN signal is partially activated and deactivated within each cycle of the CLKP signal. Since DLL 220 is activated and deactivated by the EN signal, DLL 200 is partially activated and deactivated within each cycle of the CLKP when the EN signal is partially activated and deactivated within each cycle of the CLKP.

When memory device 100 (FIG. 1) is not in the self refresh mode, DLL 220 is activated if one of the banks 0–M (FIG. 1) is active and periodically deactivated if none of the banks 0–M is active. In the self refresh mode, DLL 220 is deactivated.

When DLL 220 is activated, the XCLK and CLKDLL signals are synchronized; the CLKDLL signal toggles with the XCLK signal. When DLL 220 is deactivated, the XCLK and CLKDLL signals are not synchronized; the CLKDLL signal remains at the same level while the XCLK signal toggles.

The SREF signal indicates whether or not memory device 100 (FIG. 1) is in the self refresh mode. For example, one state (signal level) of the SREF signal indicates the memory device is in the self refresh mode and another state of the SREF signal indicates the memory device is not in the self refresh mode.

The BSEL signal indicates whether or not one or none of the banks 0–M (FIG. 1) is active. For example, one state of the BSEL signal indicates one of the banks 0–M is active and another state of the BSEL signal indicates none of the banks 0–M is active. When one of the banks 0–M is active, memory device 100 is in a bank active mode.

Figure 3:
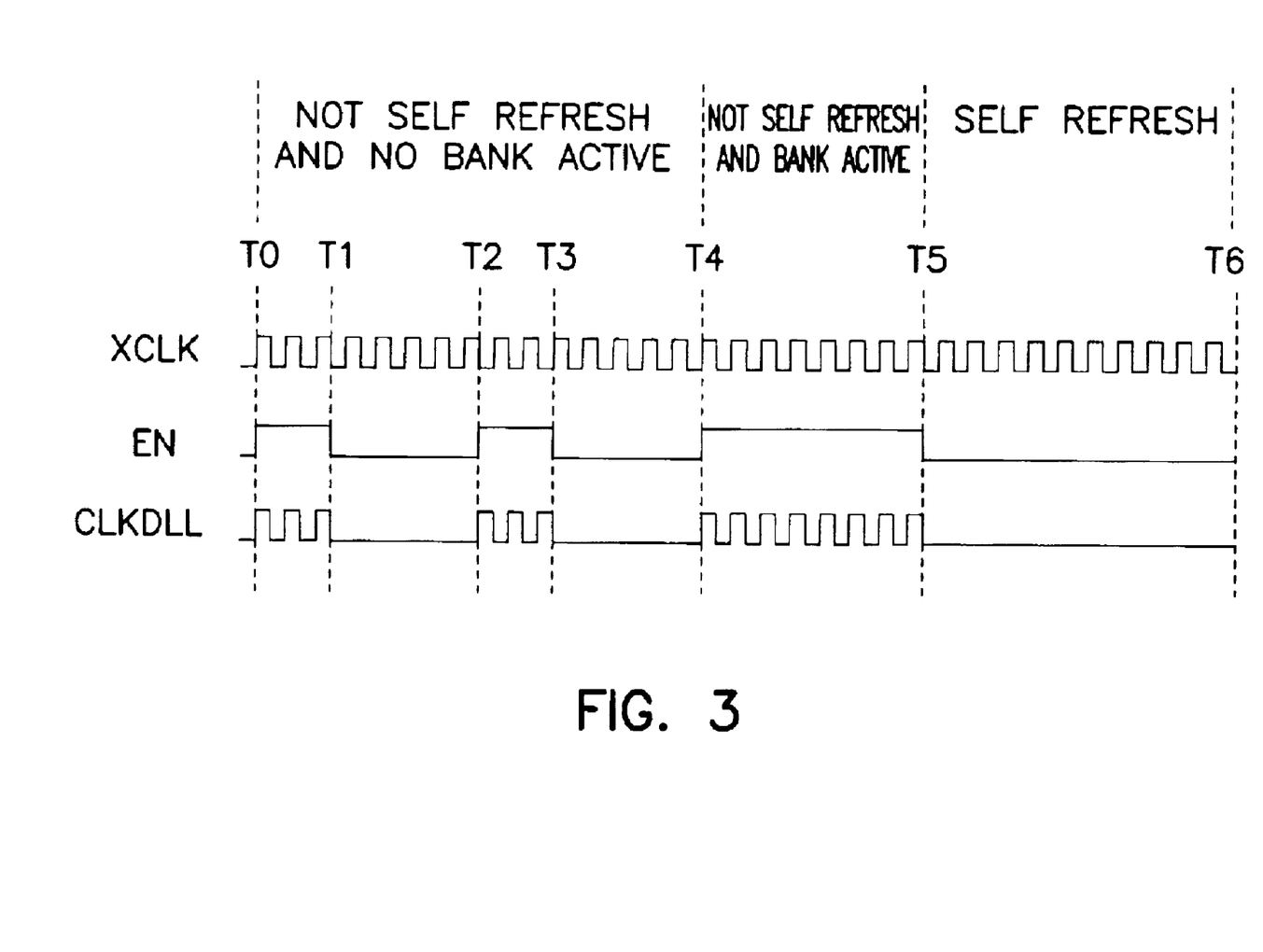
FIG. 3 shows an example of a timing diagram for FIG. 2.

FIG. 3 shows an example of a timing diagram of the XCLK, CLKDLL, and EN signals. T0 through T6 indicate reference times. Between times T0 and T4, the memory device is not in the self refresh mode and none of the memory banks is active. Between time T4 and T5, the memory device is not in the self refresh mode but one of the memory banks is active. Between time T5 and T6 the memory device is in the self refresh mode.

Between times T0 and T4, the EN signal is periodically activated and deactivated. The EN signal is periodically activated (high) between times T0–T1, and T2–T3 to periodically activate DLL 220. When DLL 220 is activated, the CLKDLL signal toggles in synchronism with the XCLK signal. The EN signal is periodically deactivated (low) between times T1–T2, and T3–T4 to periodically deactivate DLL 200. When DLL 200 is deactivated the CLKDLL signal remains at the same level while the XCLK signal toggles.

Between times T4 and T5, the EN signal is completely activated instead of periodically activated because one of the banks 0–M is active. Since the EN signal is activated, DLL 220 is activated and the CLKDLL signal toggles in synchronism with the XCLK signal.

Between times T5 and T6, the EN signal is completely deactivated because the memory device is in the self refresh mode. Since the EN signal is deactivated, DLL 220 is deactivated and the CLKDLL signal remains at the same level while the XCLK signal toggles.

Figure 4:
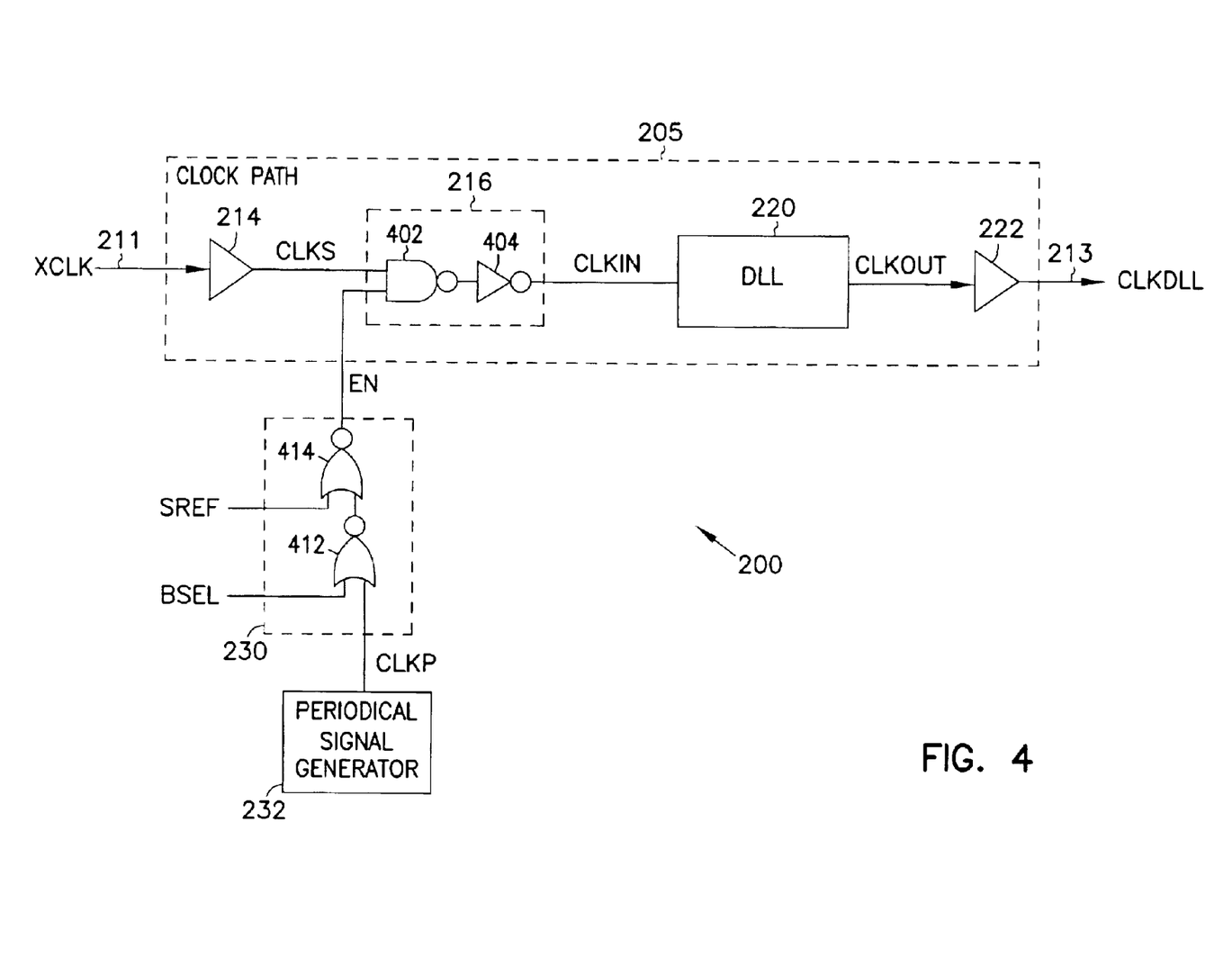
FIG. 4 shows an exemplary implementation of the portion of the memory device of FIG. 2.

FIG. 4 shows an exemplary implementation of the portion of a memory device of FIG. 2 according to an embodiment of the invention. FIG. 4, shows implementations of enable circuit 216 and enable signal generator 230. Enable circuit 216 includes a NAND gate 402 having input nodes to receive the CLKS and EN signals. The output of NAND gate 402 connects to an input of an inverter 404, which has an output node to output the CLKIN signal. Enable signal generator 230 includes a NOR gate 412 having input nodes to receive the BSEL and CLKP signals and an output node connected to an input node of a NOR gate 414. Another input node of NOR gate 414 receives the SREF signal. The output of NOR gate 414 outputs the EN signal.

NAND gate 402 and inverter 404 form an input logic circuit that allows the CLKIN signal to toggle with the CLKS signal when the EN signal is activated. When the EN signal is deactivated, the CLKIN signal remains at the same level regardless of the signal level of the CLKS signal. When the CLKIN signal toggles with the CLKS signal, DLL 220 is activated to allow the CLKDLL signal to toggle in synchronism with the XLCK signal. When the CLKIN signal remains at the same level, DLL 220 is deactivated to hold the CLKDLL signal at the same level while the XCLK signal toggles.

NOR gates 412 and 414 form an enable logic circuit that allows the EN signal to toggle with the CLKP signal when both the SREF and BSEL signals are deactivated. When either the SREF signal or the BSEL signal is activated, the EN signal is deactivated to remain at the same level. The CLKP signal is a periodic signal which periodically toggles between a low signal level and a high signal level. Thus, when the EN signal toggles with the CLKP signal, the EN signal is periodically activated (high) and deactivated (low). In some embodiments, the CLKP signal includes a plurality of periodic cycles, each having a cycle time. Each cycle time has a first time interval and a second time interval. Each time interval corresponds to a portion of the cycle time in which the CLKP has a different signal level. For example, the first time interval corresponds to the time when the CLKP has a high signal level and the second time interval corresponds to the time when the CLKP has a low signal level. The EN signal is activated or deactivated during either the first or the second time interval of each periodic cycle of the CLKP signal.

Figure 5:
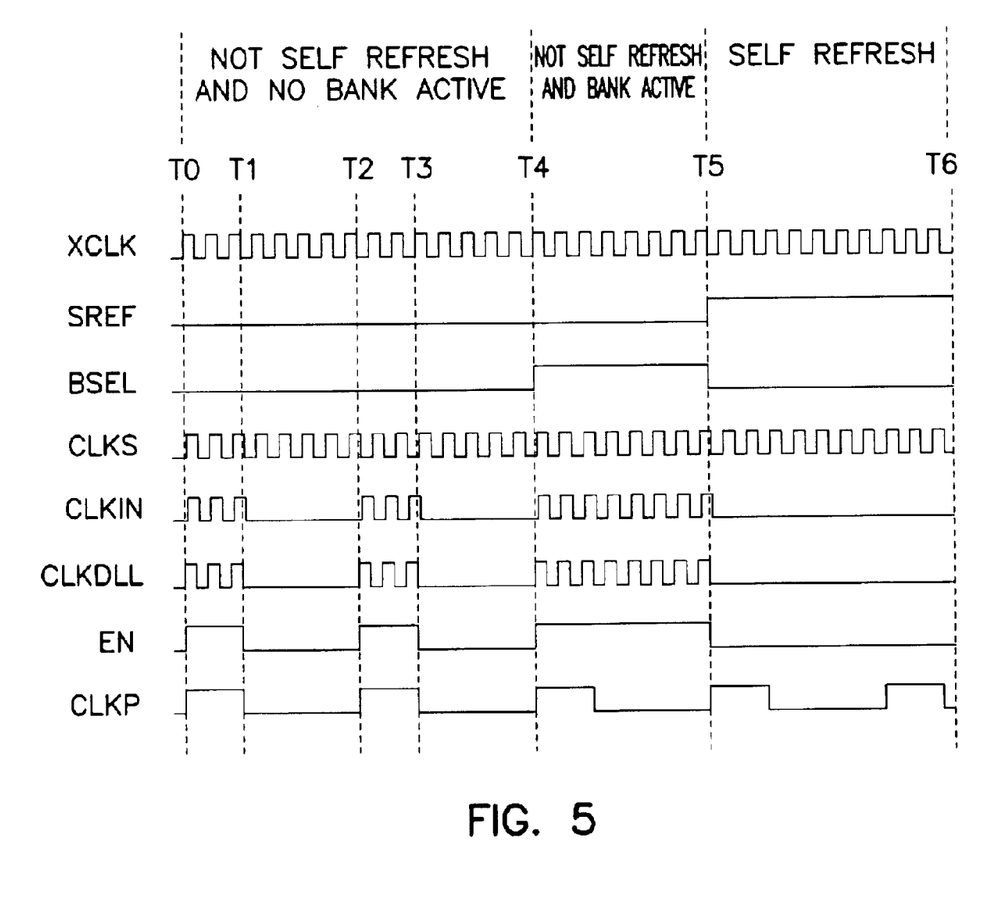
FIG. 5 is a timing diagram for FIG. 4.

FIG. 5 is a timing diagram for FIG. 4. Between times T0 and T4, the SREF signal is low, indicating the memory device is not in the self refresh mode and the BSEL signal is low, indicating none of the memory banks is active. In these modes, the EN signal follows the CLKP signal, toggling periodically between low and high levels. When the EN signal is high, the CLKIN signal follows the CLKS signal, and the CLKDLL signal follows the XLCK signal. When the EN signal is low, the CLKIN remains at the same level.

Between times T4 and T5, the BSEL signal is high, indicating the memory device is in a bank active mode (one of the memory banks is active). In this mode, the EN signal is high and remains high as long as the BSEL stays high. Between these times, the CLKIN signal follows the CLKS signal, and the CLKDLL signal follows the XLCK signal.

Between times T5 and T6, the SREF signal is high, indicating the memory device is in the self refresh mode. In this mode, the EN signal is low and remains low as long as the SREF stays high. Between these times, since the EN signal is low, the CLKIN remains low. Thus, the CLKDLL signal also remains low (deactivated).

Figure 6:
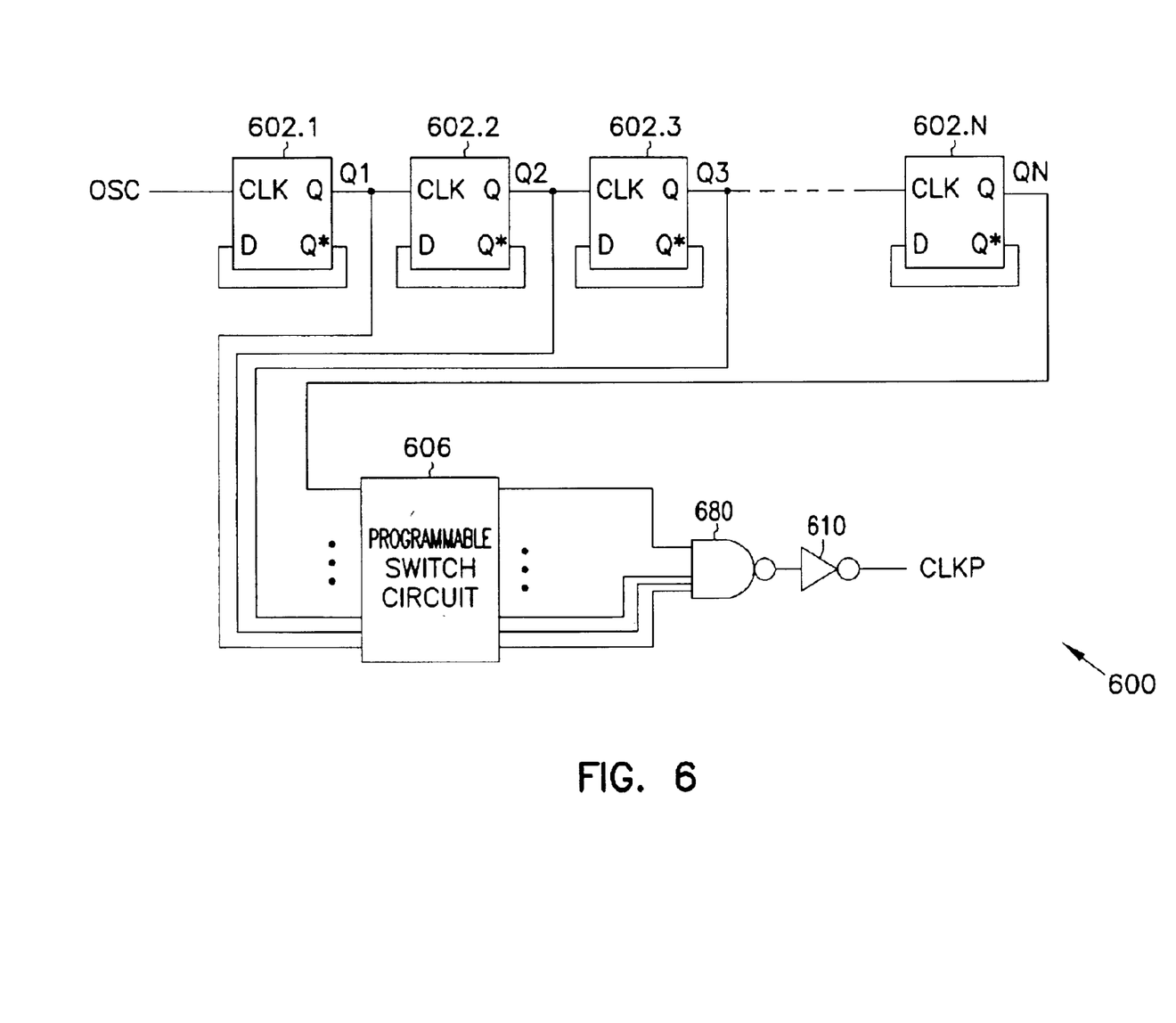
FIG. 6 shows a periodic signal generator according to an embodiment of the invention.

FIG. 6 shows a periodic signal generator according to an embodiment of the invention. Periodic signal generator 600 corresponds to periodic signal generator 232 (FIG. 2). Periodic signal generator 600 includes an input node to receive an input signal OSC and an output node to output a periodic signal CLKP. Periodic signal generator 600 includes a plurality of flip flops 602.1 through 602.N, each having two input nodes CLK and D and two output nodes Q and Q*. In some embodiments, each of the flip flops 602.1–602.N is a D-Q flip flop. Flip flops 602.1–602.N form a frequency divider that divides the OSC signal into a plurality of signals Q1 through QN, each succeeding signal having a cycle time equal to twice the cycle time of the preceding signal. The QN signal has a cycle time equal to $2^N$ times the cycle time of the OSC signal, where N is the total number of flip flops 602.1–602.N. The Q1–QN signals feed a programmable switch circuit 606, which connects in series with a NAND gate 608 and an inverter 610. Programmable switch circuit 606 is programmed to select a selected number of the Q1–QN signals. NAND gate 608 and inverter 610 form a clock logic circuit to generate the CLKP signal having a cycle time dependant on the selected number of the Q1–QN signals. The OSC signal is a periodic signal and can be generated by any conventional method. For example, the OSC signal can be generated by a conventional oscillator. The cycle time of the OSC can be chosen by selecting appropriate elements of the oscillator.

Figure 7:
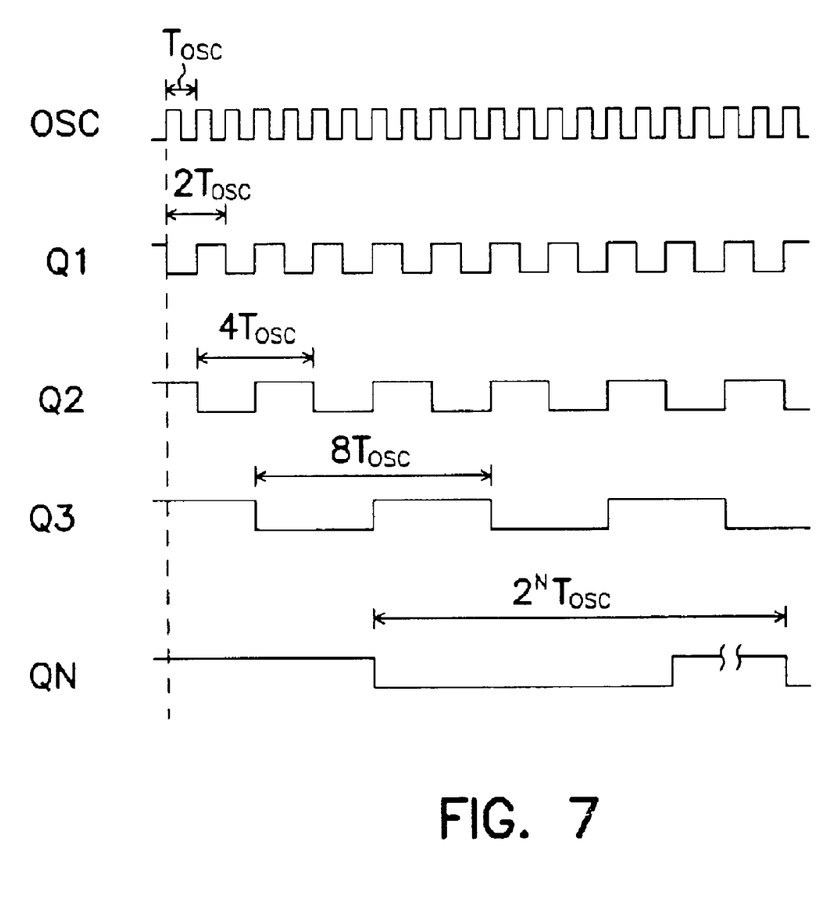
FIG. 7 is a timing diagram for a frequency divider of FIG. 6.

FIG. 7 is a timing diagram for the frequency divider of FIG. 6. For clarity, FIG. 7 shows only the Q1, Q2, Q3, and QN signals. The OSC signal has a cycle time $T_{OSC}$. The Q1 signal has a cycle time equaled to $2^1=2$ times $T_{OSC}$. The Q2 signal has a cycle time equaled to $2^2=4$ times $T_{OSC}$. The Q3 signal has a cycle time equaled to $2^3=8$ times $T_{OSC}$. The QN signal has a cycle time of $2^N$ times $T_{OSC}$.

Figure 8:
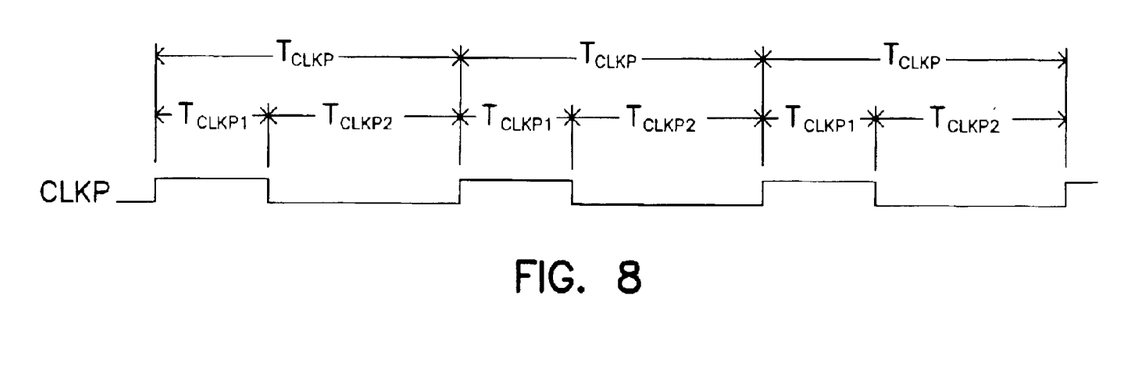
FIG. 8 shows an example of a periodic signal.

In FIG. 6, since the OSC signal is a periodic signal, the CLKP signal is also a periodic signal. FIG. 8 shows one example of the CLKP signal. The CLKP signal has a plurality of periodic cycles, each including a cycle time $T_{CLKP}$. Each $T_{CLKP}$ is divided into a first time interval $T_{CLKP1}$ and a second time interval $T_{CLKP2}$. Each time interval corresponds to a portion of $T_{CLKP}$ in which the CLKP has a different signal level. For example, $T_{CLKP1}$ corresponds to the time when the CLKP signal has a high signal level and $T_{CLKP2}$ corresponds to the time when the CLKP signal has a low signal level.

Each $T_{CLKP}$ has a $T_{CLKP1}$ to $T_{CLKP2}$ ratio corresponding to a ratio signal levels of each $T_{CLKP}$. For example, the $T_{CLKP1}$ to $T_{CLKP2}$ ratio is the ratio of the high signal level to the low signal level. The $T_{CLKP1}$ to $T_{CLKP2}$ ratio is determined by choosing a selected number of the Q1–QN signals. The selected number of the Q1–QN signals is chosen according to a formula for the $T_{CLKP1}$ to $T_{CLKP2}$ ratio, which is $1/2^N$ to $(1-(1/2^N))$. After the selected number of the Q1–QN signals is chosen, programmable switch circuit 606 selects the appropriate number of the Q1–QN signals as input to NAND gate 608. For example, if the $T_{CLKP1}$ to $T_{CLKP2}$ ratio is chosen to be 1/4 to 1-(1/4), then $1/2^N=1/4$ or N=2. In this example, programmable switch circuit 606 would select two of the Q1–QN signals which are Q1 and Q2 signals. As another example, if the ratio is chosen to be 1/8 to 1-(1/8), then $1/2^N=1/8$ or N=3. In this example, programmable switch circuit 606 would select three of the Q1–QN signals which are Q1, Q2, and Q3 signals. Other $T_{CLKP1}$ to $T_{CLKP2}$ ratios can also be chosen by selecting an appropriate number of the Q1–QN signals.

Figure 9:
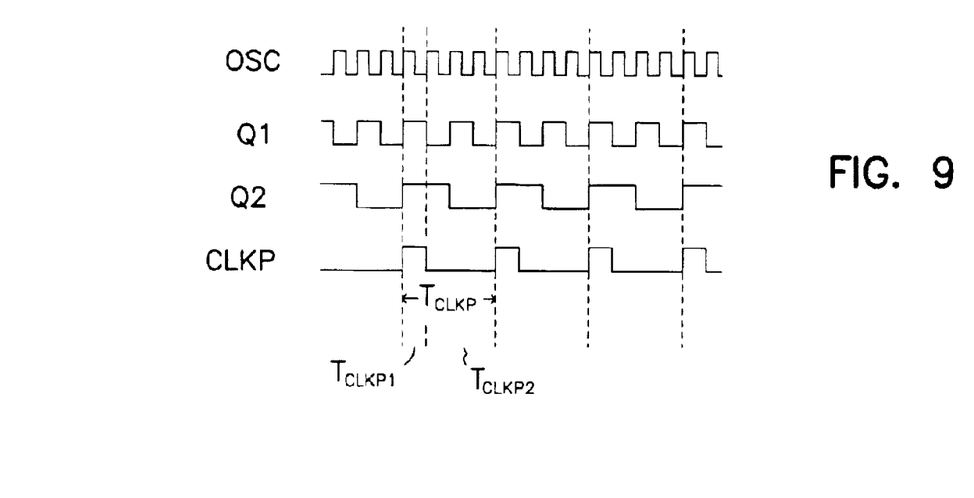
FIG. 9 is a timing diagram for periodic signal generator of FIG. 6.

FIG. 9 shows a timing diagram for periodic signal generator 600 when N=2. In this case, the $T_{CLKP1}$ to $T_{CLKP2}$ ratio of each $T_{CLKP}$ is 1/4 to 3/4. FIG. 9 shows that for each $T_{CLKP}$, the CLKP signal is high 1/4 of the time (1/4 of $T_{CLKP}$) and low 3/4 of the time (3/4 of $T_{CLKP2}$).

Figure 10:
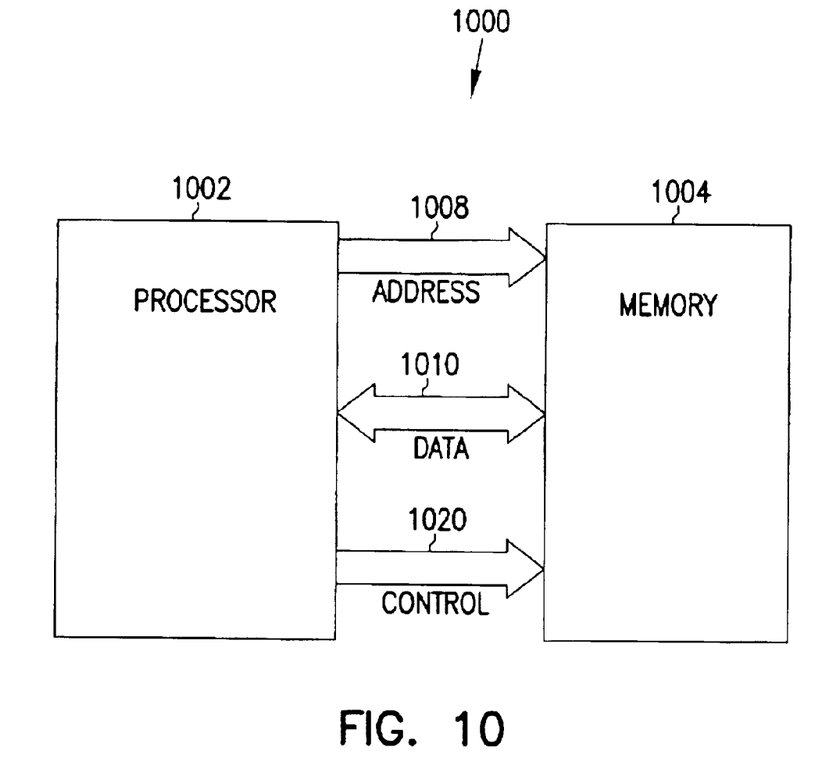
FIG. 10 shows a system according to one embodiment of the invention.

FIG. 10 shows a system according to one embodiment of the invention. System 1000 includes a first integrated circuit (IC) 1002 and a second IC 1004. ICs 1002 and 1004 can include processors, controllers, memory devices, application specific integrated circuits, and other types of integrated circuits. In embodiments represented by FIG. 10, for example, IC 1002 represents a processor, and IC 1002 represents a memory device 1004. Processor 1002 and memory device 1004 communicate using address signals on lines 1008, data signals on lines 1010, and control signals on lines 1020.

Memory device 1004 can be memory device 100 of FIG. 1. In some embodiments memory device 1004 includes a portion of memory device such as portions 200 (FIG. 2).

System 1000 represented by FIG. 10 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Conclusion

Various embodiments of the invention describe circuits and methods to periodically control a DLL in certain modes of operations of a memory device to save power. Although specific embodiments are described herein, those skilled in the art recognize that other embodiments may be substituted for the specific embodiments shown to achieve the same purpose. This application covers any adaptations or variations of the present invention. Therefore, the present invention is limited only by the claims and all available equivalents.

What is claimed is:

1. A memory device comprising:
   a plurality of memory banks for storing data;
   a clock path for receiving an external signal to generate an internal signal to control a transfer of the data from the memory banks, the clock path including a delay locked loop for synchronizing the external and internal signals; and
   a clock path controller connected to the clock path, the clock path controller including a periodic signal generator for generating a periodic signal for periodically controlling the delay locked loop in response to modes of operations of the memory device.

2. The memory device of claim 1, wherein the clock path controller includes an enable logic circuit connected to the clock path to activate and deactivate the delay locked loop based on a self refresh mode and a bank active mode.

3. The memory device of claim 2, wherein the enable logic circuit includes a first input node for receiving a self refresh enable signal to deactivate the delay locked loop when the self refresh enable signal indicates the memory device is in a self refresh mode.

4. A memory device comprising:
   a plurality of memory banks for storing data;
   a clock path for receiving an external signal to generate an internal signal to control a transfer of the data from the memory banks, the clock path including a delay locked loop for synchronizing the external and internal signals; and
   a clock path controller connected to the clock path for periodically controlling the delay locked loon in response to modes of operations of the memory device, wherein the clock path controller includes an enable logic circuit connected to the clock path to activate and deactivate the delay locked loop based on a self refresh mode and a bank active mode, the enable logic circuit including:
   a first input node for receiving a self refresh enable signal to deactivate the delay locked loop when the self refresh enable signal indicates the memory device is in a self refresh and
   a second input node for receiving the bank select signal to periodically deactivate the delay locked loop when the self refresh enable signal indicates the memory device is not in a self refresh mode and the bank select signal indicates none of the memory banks is activated.

5. The memory device of claim 2, wherein the periodic signal generator includes:
   a plurality of flip flops having a plurality of output nodes;
   a programmable switch circuit connected to the flip flops to select output nodes of the flip flops; and
   a clock logic circuit connected to the programmable switch circuit to output the periodic signal.

6. The memory device of claim 5, wherein the clock path further includes an input logic circuit connected to the delay locked loop and the clock path for controlling an input signal at an input of the delay locked loop.

7. A memory device comprising:
   a clock path for receiving an external signal to generate an internal signal, the clock path including a delay locked loop for synchronizing the external and internal signals; and
   a clock path controller connected to the clock path, the clock path controller including:
   a periodic signal generator for generating a periodic signal having a plurality of periodic cycles; and
   an enable signal generator connected to the periodic signal generator to periodically deactivate the delay locked loop.

8. The memory device of claim 7, wherein the enable signal generator includes a first input node for receiving a self refresh enable signal to deactivate the delay locked loop based on a first state of the self refresh enable signal.

9. A memory device comprising:
   a clock path for receiving an external signal to generate an internal signal, the clock path including a delay locked loop for synchronizing the external and internal signals; and
   a clock path controller connected to the clock path, the clock path controller including:
   a periodic signal generator for generating a periodic signal having a plurality of periodic cycles; and
   an enable signal generator connected to the periodic signal generator to periodically deactivate the delay locked loop, the enable signal generator including:
   a first input node for receiving a self refresh enable signal to deactivate the delay locked loon based on a first state of the self refresh enable signal; and
   a second input node for receiving a bank select signal to periodically deactivate the delay locked loop based on the periodic signal and a second state of the self refresh signal.

10. The memory device of claim 9, wherein the periodic signal generator includes:
    a frequency divider;
    a programmable switch circuit connected to the frequency divider; and a clock logic circuit connected to the programmable switch circuit to output the periodic signal.

11. The memory device of claim 7, wherein the clock path further includes an enable circuit connected to the delay locked loop and the clock path for controlling an input signal at an input of the delay locked loop.

12. A memory device comprising:
a delay locked loop connected between an external node and an internal node for delaying an external signal to generate an internal signal synchronized with the external signal;
an enable circuit connected between the external input node and the delay locked loop for controlling a passage of the external clock signal to the delay locked loop;
a periodic signal generator for generating a periodic signal including a plurality of periodic cycles; and
an enable signal generator connected to the periodic signal generator and the enable circuit for partially deactivating the delay locked loop within each of the periodic cycles based on a self refresh mode and a bank active mode of the memory device.

13. The memory device of claim 12, wherein the enable circuit includes logic gates connected between the external node and the delay locked loop.

14. The memory device of claim 13, wherein enable generator includes logic gates for outputting an enable signal based on a combination of inputs signals indicating the self refresh node and the bank active mode.

15. The memory device of claim 12, wherein periodic signal generator includes:
a plurality of flip flops having a plurality of output nodes;
a programmable switch circuit connected to the output nodes; and
a clock logic circuit connected to the programmable switch circuit to output the periodic signal.

16. A system comprising:
a processor; and
a memory device connected to the processor, the memory device including:
a plurality of memory banks to store data;
a clock path for receiving an external signal to generate an internal signal to control a transfer of the data from the memory banks, the clock path including a delay locked loop for synchronizing the external and internal signals; and
a clock path controller connected to the clock path, the clock path controller including a periodic signal generator for generating a periodic signal for periodically controlling the delay locked loop in response to modes of operations of the memory device.

17. The system of claim 16, wherein the clock path controller includes an enable logic circuit connected to the clock path to activate and deactivate the delay locked loop based a self refresh mode and a bank active mode of the memory device.

18. A system comprising:
a processor; and
a memory device connected to the processor, the memory device including:
a plurality of memory banks to store data;
a clock path for receiving an external signal to generate an internal signal to control a transfer of the data from the memory banks, the clock path including a delay locked loop for synchronizing the external and internal signals; and
a clock path controller connected to the clock path for periodically controlling the delay locked loop in response to modes of operations of the memory device, wherein the clock path controller includes an enable logic circuit connected to the clock path to activate and deactivate the delay locked loop based a self refresh mode and a bank active mode of the memory device, wherein the enable logic circuit includes input nodes to receive a first input signal and a second input signal for periodically deactivating the delay locked loop when the first and second input nodes indicate the memory device is not in self refresh and bank active modes.

19. The system of claim 16, wherein the clock path further includes a logic circuit connected to the delay locked loop and the clock path for controlling an input signal at an input of the delay locked loop.

20. A system comprising:
a processor; and
a memory device connected to the processor, the memory device including:
a clock path for receiving an external signal to generate an internal signal, the clock path including a delay locked loop for synchronizing the external and internal signals; and
a clock path controller connected to the clock path, the clock path controller including:
a periodic signal generator for generating a periodic signal having a plurality of periodic cycles; and
an enable signal generator connected to the periodic signal generator periodically deactivate the delay locked loop.

21. The system of claim 20, wherein the enable signal generator includes a first input node to receive the self refresh enable signal to deactivate the delay locked loop based on a first state of the self refresh enable signal.

22. A system comprising:
a processor; and
a memory device connected to the processor, the memory device including:
a clock path for receiving an external signal to generate an internal signal, the clock path including a delay locked loop for synchronizing the external and internal signals; and
a clock path controller connected to the clock path, the clock path controller including:
a periodic signal generator for generating a periodic signal having a plurality of periodic cycles; and
an enable signal generator connected to the periodic signal generator periodically deactivate the delay locked loop, wherein the enable signal generator includes a first input node to receive the self refresh enable signal to deactivate the delay locked loon based on a first state of the self refresh enable signal, and wherein the enable signal generator further includes a second input node to receive the bank select signal for periodically deactivating the delay locked loop based on the periodic signal and a second state of the self refresh signal.

23. The system of claim 22, wherein periodic signal generator includes:
a frequency divider;
a programmable switch circuit connected to the frequency divider; and a clock logic circuit connected to the programmable switch circuit to output the periodic signal.

24. The system of claim 23, wherein the clock path further includes a logic circuit connected to the delay locked loop and the clock path for controlling an input signal at an input of the delay locked loop.

25. A system comprising:
a processor; and
a memory device connected to the processor, the memory device including:
 a delay locked loop connected between an external node and an internal node for delaying an external signal to generate an internal signal synchronized with the external;
 an enable circuit connected between the external input node and the delay locked loop for controlling a passage of the external clock signal to the delay locked loop;
 a periodic signal generator for generating a periodic signal including a plurality of periodic cycles; and
 an enable signal generator connected to the periodic signal generator and the enable circuit to partially deactivate the delay locked loop within each of the periodic cycles based on a self refresh mode and a bank active mode.

26. The system of claim 25, wherein the enable circuit includes logic gates connected between the external node and the delay locked loop.

27. The system of claim 26, wherein enable generator includes logic gates for outputting an enable signal based on a combination of inputs signals indicating the self refresh node and the bank active mode.

28. The system of claim 25, wherein periodic signal generator includes:
 a plurality of flip flops having a plurality of output nodes;
 a programmable switch circuit connected to the output nodes; and
 a clock logic circuit connected to the programmable switch circuit to output the periodic signal.

29. A method of operating a memory device, the method comprising:
 activating a delay locked loop in a first mode of operation of the memory device to produce an internal signal based on an external signal;
 generating a periodic signal having a plurality of periodic cycles; and
 partially deactivating the delay locked loop in each of the periodic cycles in a second mode of operation of the memory device.

30. The method of claim 29, wherein generating a periodic signal including generating the periodic signal independent from the external signal.

31. The method of claim 30, wherein in the first mode of operation, a memory bank of the memory device is activated.

32. The method of claim 31, wherein in the second mode none of memory banks of the memory device is activated and the memory device is not in the self refresh mode.

33. The method of claim 32, wherein partially deactivating the delay locked loop includes:
 holding the internal signal at the same level for a first time interval within each of the periodic cycles; and
 toggling the internal signal between multiple signal levels for a second time interval within each of the periodic cycles.

34. The method of claim 33, wherein the periodic signal has a cycle time that is substantially greater a cycle time of the external signal.

35. A method of operating a memory device, the method comprising:
 generating an internal signal based on an external signal;
 generating a period signal; and
 partially deactivating the internal signal within each cycle of the periodic signal when the memory device is in certain modes of operations.

36. The method of claim 35, wherein the internal signal is a periodic signal.

37. The method of claim 36, wherein the periodic signal is generated independently from the external and internal signals.

38. The method of claim 36, wherein partially deactivating the internal signal occurs when the memory device is not in a self refresh mode and none of memory banks of the memory device is active.

39. The method of claim 38, wherein partially deactivating the internal signal includes holding the internal signal at the same signal level in each cycle of a periodic signal for a time interval that is less than a cycle time the periodic signal.

40. The method of claim 39, wherein generating the internal signal includes synchronizing the internal signal with the external signal.

41. The method of claim 35 further includes partially activating the internal signal within each cycle of a periodic signal when the memory device is not in a self refresh mode and none of memory banks of the memory device is active.

42. The method of claim 41, wherein partially activating the internal signal includes toggling the internal signal between a low signal level and a high signal level in each cycle of a periodic signal for a time interval that is less than a cycle time the periodic signal.

43. A method of operating a memory device, the method comprising:
 receiving an external signal;
 generating an internal signal based on the external signal;
 generating a periodic signal independent from the external signal;
 partially deactivating the internal signal during a cycle of the periodic signal; and
 partially activating the internal signal during the cycle of the periodic signal.

44. The method of claim 43, wherein generating the internal signal includes synchronizing the internal signal with the external signal.

45. The method of claim 43, wherein partially deactivating the internal signal includes holding the internal signal at the same signal level during a first time interval of the cycle of the periodic signal.

46. The method of claim 45, wherein partially activating the internal signal includes toggling the internal signal between a low signal level and a high signal level during a second time interval of the cycle of the periodic signal.

47. The method of claim 43, wherein partially deactivating the internal signal includes holding the internal signal at the same signal level during a first time interval of each cycle of the periodic signal when the memory device is not in self refresh and bank active modes.

48. The method of claim 47, wherein partially activating the internal signal includes toggling the internal signal between a low signal level and a high signal level during a second time interval of the cycle of the periodic signal in each cycle of the periodic signal when the memory device is not in self refresh and bank active modes.

* * * * *